United States Patent [19]
Harris et al.

[11] Patent Number: 6,025,608
[45] Date of Patent: Feb. 15, 2000

[54] SEMICONDUCTOR DEVICE OF SIC WITH INSULATING LAYER AND A REFRACTORY METAL NITRIDE LAYER

[75] Inventors: Christopher Harris, Sollentuna; Erik Danielsson, Bromma, both of Sweden

[73] Assignee: ABB Research Ltd., Zurich, Switzerland

[21] Appl. No.: 08/972,253

[22] Filed: Nov. 18, 1997

[51] Int. Cl.[7] .................. H01L 31/0312; H01L 29/772; H01L 23/48; H01L 29/51
[52] U.S. Cl. .................. 257/77; 257/289; 257/410; 257/411; 257/751; 257/764; 257/770
[58] Field of Search .................. 257/77, 289, 410, 257/411, 751, 764, 770

[56] References Cited

U.S. PATENT DOCUMENTS

| | | | |
|---|---|---|---|
| 4,935,804 | 6/1990 | Ito et al. | 357/71 |
| 5,124,779 | 6/1992 | Furukawa | 257/289 |
| 5,216,264 | 6/1993 | Fujii | 257/289 |
| 5,597,744 | 1/1997 | Kamiyama et al. | 437/40 |
| 5,742,076 | 4/1998 | Sridevan | 257/289 |

FOREIGN PATENT DOCUMENTS 0 697 714 A1 of 1996 European Pat. Off. .

*Primary Examiner*—Jerome Jackson, Jr.
*Attorney, Agent, or Firm*—Pollock, Vande Sande & Amernick

[57] ABSTRACT

A semiconductor device comprises at least one semiconductor layer of SiC and a layer of a refractory metal nitride separated by an insulating layer located next to the SiC layer of $SiO_2$. The insulating layer comprises two sub layers, namely a first sub layer of $SiO_2$ next to the SiC layer and a second sub layer of $Si_3N_4$ located between the first sub layer and the metal nitride layer.

7 Claims, 1 Drawing Sheet

SEMICONDUCTOR DEVICE OF SIC WITH INSULATING LAYER AND A REFRACTORY METAL NITRIDE LAYER

TECHNICAL FIELD

The present invention relates to a semiconductor device comprising at least one semiconductor layer of SiC and a layer of a refractory metal nitride separated by an insulating layer located at least next to the SiC layer of $SiO_2$.

BACKGROUND OF THE INVENTION

It is well known that semiconductor devices fabricated from SiC are in principle able to operate at very high temperatures, since SiC has a high thermal stability, so that it will have a stable function at much higher temperatures than Si, namely well up to 1000° K. In addition, for semiconductor device made of SiC it is necessary to anneal the layer next to a contact at comparatively high temperatures, namely at least 800° C. when this layer has a very high doping concentration and otherwise even higher, to form in this way a high density of interface defects next to the contact layer and by that an ohmic contact. The need of such a high temperature anneal requires the use of a refractory metal in devices where a metal layer has to be placed on the SiC layer with an insulating layer therebetween, such as a gate contact in gate controlled devices as MOSFETs and IGBTs or field rings for reducing the electric field at the edges of a semiconductor device. "Refractory metal" is here defined as a metal having a low reactivity at high temperatures.

It has been found that refractory metal nitrides, such as MoN, TaN and particularly TiN would be well suited for forming such metal layers. They are especially suitable for forming the gate contact of a gate controlled semiconductor device of SiC, and this particular application will hereinafter be discussed in order to illuminate but in no way restrict the invention and the problems to be solved thereby.

As already mentioned, it has previously been recognized that a possible gate contact could be formed using deposited TiN, and this has been disclosed in for instance, EP 0 697 714. Besides the fact that TiN is a refractory metal, it is also an efficient diffusion barrier which should limit extrinsic degradation. However, experiments have shown that although a stable gate contact may be formed using TiN on $SiO_2$, this appears to be only stable up to 600° C. For the reason mentioned above, it is not stable for the high temperatures necessary for ohmic contact anneals and unfortunately neither sufficiently stable for long term high temperature operation of such a semiconductor device. This is due to the fact that Ti is very reactive with respect to oxygen, and it has been identified that there will be an interface reaction of $SiO_2$ with TiN to form $TiO_2$, which is a contributing instability mechanism. This problem may also be there for the other refractory metal nitrides that may be considered.

SUMMARY OF THE INVENTION

The object of the present invention is to provide a semiconductor device of the type defined in the introduction capable to operate at the high temperatures possible due to the properties of SiC itself and enabling an ohmic contact anneal at the high temperatures needed for a satisfying result without any introduction of instability mechanisms due to reactions of the refractory metal nitride with other elements.

This object is obtained according to the invention by making the insulating layer of such a device constituted by two sub layers, namely a first sub layer of $SiO_2$ next to the SiC layer and a second sub layer of $Si_3N_4$ located between the first sub layer and the metal nitride layer.

The insulating layer of $Si_3N_4$ between the $SiO_2$ layer and the refractory metal nitride layer will efficiently prevent the interface reaction of $SiO_2$ with the metal nitride. This has especially been demonstrated for TiN as refractory metal nitride, and it has been found that ohmic contact anneal may with such an additional layer as the second sub layer be carried out up to 800° C. without introducing any instability mechanisms due to interface reactions. The fact that the additional layer is made of a material having one element, nitrogen, in common with the metal nitride located on one side thereof and the other element, Si, in common with the $SiO_2$ layer located on the other side thereof, has turned out to limit possible reactions at the interfaces between the second sub layer and the first sub layer on one hand and the second sub layer and the refractory metal nitride layer on the other.

According to a preferred embodiment of the invention the second sub layer of $Si_3N_4$ is thin with respect to the first sub layer of $SiO_2$. It has turned out that a thin $Si_3N_4$ layer will be enough for obtaining the results aimed at, namely to prevent interface reactions contributing to instability mechanisms from occurring, and such a thin additional layer is very advantageous in gate controlled devices when the refractory metal nitride is used as a gate contact, since it will not contribute to the capacitance of the device or to the threshold voltage to be applied on the gate contact for forming a conducting inversion channel at the interface between the $SiO_2$ layer and the SiC layer and by that not influencing the charge mobility of such a channel.

According to another preferred embodiment of the invention the thickness of the second sub layer is less than a third of the thickness of the first sub layer. Such a thickness will be enough to prevent the said interface reactions resulting in instability mechanisms at the high temperatures in question.

According to another preferred embodiment of the invention the metal nitride layer is made of TiN. As already mentioned, it has turned out that TiN is very suitable as a refractory metal for semiconductor devices of SiC, in which it is desired to utilize the properties of SiC with respect to the stability at high temperatures. It may now also be utilized without any adverse effects of the high temperatures upon the stability of the device in the region of the insulating layer.

According to another preferred embodiment of the invention the semiconductor device is gate-controlled and the layer of a refractory metal nitride forms a gate contact of the device adapted to, upon applying a certain potential thereon, form a conducting inversion channel in the SiC layer at the interface between the SiC layer and the first sub layer of $SiO_2$. This is a very preferred embodiment of the invention, since the advantages of better operational stability and a higher mobility in operation at high temperatures compared to prior art gate-controlled semiconductor devices are significant.

According to other preferred embodiments of the invention the semiconductor device is a MOSFET and an IGBT, respectively. The MOS structure of such devices will in this way have a stable gate metallization allowing stable operation at high temperatures.

Further advantages and advantageous characteristics of the invention appear from the description following below.

BRIEF DESCRIPTION OF THE DRAWING

With reference to the appended drawing, below follows a specific description of a preferred embodiment of the invention cited as an example.

In the drawing.

DETAILED DESCRIPTION OF A PREFERRED EMBODIMENT(S)

Figure 1:
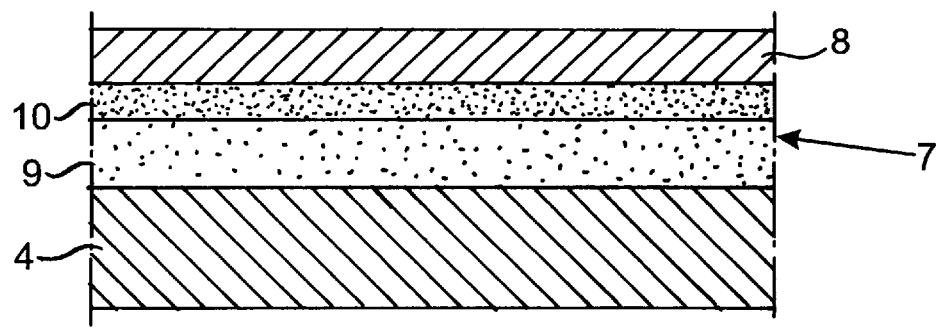
FIG. 1 is a very schematic cross-sectioned view of a part of a semiconductor device according to a preferred embodiment of the invention.
Figure 2:
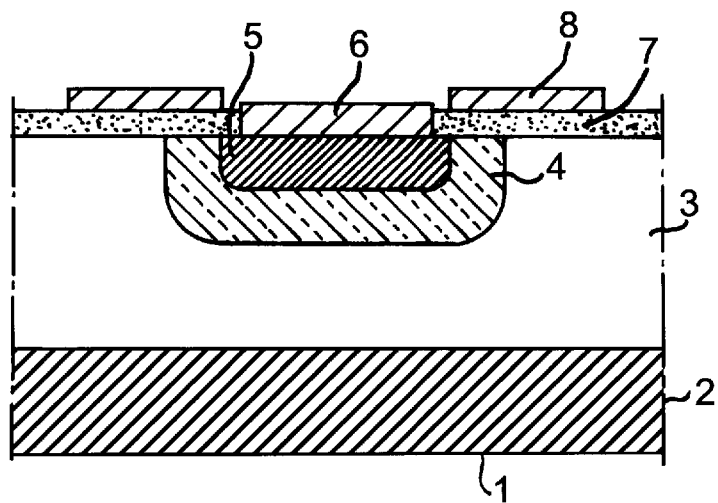
FIG. 2 is a sectioned view in a smaller scale of a semiconductor device according to a preferred embodiment of the invention in the form of a MOSFET.

A portion of a MOSFET made of SiC according to a preferred embodiment of the invention is illustrated in FIG. 1. However, it should be noted that the relative dimensions of the layers and the regions of this portion of this device and the device shown in FIG. 2 have only been chosen for the sake of clarity of the drawing. This device comprises a drain 1, a highly doped n-type substrate layer 2 on top thereof and an n-type low-doped drift layer 3 on top of the substrate layer. The device also has a low-doped p-type channel region layer 4 and a highly doped n-type source region layer 5 preferably obtained by ion implantation and diffusion into the layer 3. A source contact 6 of metal is applied on the source region layer 5 The layers 2–5 are made of SiC.

The device also has an insulating layer 7 on top of the channel region layer 4 and a gate contact 8 located on top of the insulating layer 7 and extending laterally over at least the entire width of the channel region layer 4 to create a conducting inversion channel at the interface between the channel region layer 4 and the insulating layer 7 for electron transport between the source region layer 5 and the drift layer 3 upon applying a positive voltage of a sufficient level to the gate 8.

It is important that this device is annealed at a comparatively high temperature, at least in the range of 800° C., for forming a good ohmic contact between the source region layer 5 and the source metal 6 by forming a high density of interface defects therethrough.

The gate contact is here made of a refractory metal nitride, namely TiN. It is illustrated in FIG. 1 how the insulating layer 7 is made of two sub layers, namely a first sub layer 9 of $SiO_2$ next to the channel region layer 4 formed by thermal oxidation of the SiC layer, and a second sub layer 10 of $Si_3N_4$ located on top of the first sub layer between this and the gate layer 8. This layer 10 of $Si_3N_4$ is comparatively thin, so that it will not contribute to the capacitance or to the threshold of the MOSFET so designed. However, it will prevent any interface reaction of $SiO_2$ with TiN to form $TiO_2$ that has been identified as a contributing instability mechanism in such devices having the entire insulating layer made of SiO in operation at temperatures above 600° C. and through high temperature ohmic contact anneal.

It has been found that this structure will withstand annealing temperatures at least as high as 800° C. without any such detrimental interface reactions. However, at considerably higher temperatures an intermixing of $Si_3N_4$ and TiN may occur, so that Ti may then react with $SiO_2$ to form $TiO_2$ thus introducing instabilities.

It is pointed out that when we speak about TiN we do also include the fact that TiN may have different phases, such as $Ti_2N$, $Ti_3N_4$ etc, and the Ti-richer phases will fail at a lower temperature than the stoichiometric phase TiN.

The invention is not in any way restricted to the preferred embodiment described above, but many possibilities of modifications thereof would be apparent to a person ordinary skilled in the art without departing from the basic idea of the invention as defined in the appended claims.

As already stated, the invention also comprises bipolar semiconductor devices, such as an IGBT. It is also conceivable to have the layers oppositely doped, accordingly n instead of p and conversely, for obtaining a hole conduction.

The invention is applicable to any semiconductor device having at least one layer of SiC in which a metal is deposited on an insulating layer located on top of the SiC layer.

The number of layers mentioned in the claims is a minimum number, and it is within the scope of the invention to arrange further layers in the devices or dividing any layer into several layers by selective doping of different regions thereof.

We claim:

1. A semiconductor device comprising at least one semiconductor layer of SiC and a layer of a refractory metal nitride separated by an insulating layer located at least next to the SiC layer of $SiO_2$, the insulating layer comprising two sub layers, a first sub layer of $SiO_2$ next to the SiC layer and a second sub layer of $Si_3N_4$ located between the first sub layer and the metal nitride layer.

2. A semiconductor device according to claim 1, wherein said second sub layer of $Si_3N_4$ is thin as compared to the first sub layer of $SiO_2$.

3. A semiconductor device according to claim 1 wherein the thickness of the second sub layer is less than a third of the thickness of the first sub layer.

4. A semiconductor device according to claim 1 wherein said metal nitride layer is made of TiN.

5. A semiconductor device according to claim 1 wherein said device is gate-controlled and the layer of a refractory metal nitride forms a gate contact of the device adapted to, upon applying a certain potential thereon, form a conducting inversion channel in said SiC layer at the interface between the SiC layer and the first sub layer of $SiO_2$.

6. A semiconductor device according to claim 5, wherein said device is a MOSFET.

7. A semiconductor device according to claim 5, wherein said device is an IGBT.

* * * * *